(12) United States Patent
Straeussnigg et al.

(10) Patent No.: US 9,425,757 B2
(45) Date of Patent: Aug. 23, 2016

(54) APPARATUS AND METHOD FOR CONTROLLING AN AMPLIFICATION GAIN OF AN AMPLIFIER, AND A DIGITIZER CIRCUIT AND MICROPHONE ASSEMBLY

(71) Applicant: Infineon Technologies AG, Neubiberg (DE)

(72) Inventors: Dietmar Straeussnigg, Villach (AT); Andreas Wiesbauer, Poertschach (AT)

(73) Assignee: Infineon Technologies AG, Neubiberg (DE)

( * ) Notice: Subject to any disclaimer, the term of this patent is extended or adjusted under 35 U.S.C. 154(b) by 501 days.

(21) Appl. No.: 13/894,854

(22) Filed: May 15, 2013

(65) Prior Publication Data

US 2014/0341397 A1 Nov. 20, 2014

(51) Int. Cl.
*H04R 3/00* (2006.01)
*H03G 1/00* (2006.01)
*H03G 7/06* (2006.01)

(52) U.S. Cl.
CPC ............... *H03G 1/0017* (2013.01); *H03G 7/06* (2013.01)

(58) Field of Classification Search
CPC ................. H04R 2201/003; H04R 2201/00; H04R 2201/028; H04R 2201/40; H04R 2201/401; H04R 2201/405; H04R 2420/00; H04R 2420/01; H04R 2499/00; H04R 2499/01; H04R 2499/10; H04R 2499/11; H04R 2499/13; H04R 1/1091; H04R 1/10; H04R 1/08; H04R 29/001; H04R 3/00; H04R 3/002; H04R 3/04; H04R 3/02; H04R 3/007; H04R 2420/07; H04R 25/453; H04R 2217/03; H04R 2225/41; H04R 2225/43; B81B 7/00; B81C 1/00; H03G 3/225; H03G 3/301; H03G 3/3026; H03G 11/00; H03G 11/006; H03G 11/08; H03G 2201/103; H03G 2201/106; H03G 2201/202; H03G 2201/302; H03G 2201/508; H03G 2201/603; H03G 2201/606; H03G 3/001; H03G 3/32; H03G 3/3005; H03G 3/3089; H03G 7/007; G06F 3/165; G06F 17/3074; G10K 11/175; G10K 11/16
USPC ............ 381/28, 57, 319, 84, 120, 92, 26, 56, 381/94.9, 61, 321, 104, 106, 107, 110, 91, 381/122, 111, 112, 113, 114, 115, 74, 312, 381/313, 314, 316, 317, 320; 341/139, 56, 341/158, 126, 155, 161, 164, 165
See application file for complete search history.

(56) References Cited

U.S. PATENT DOCUMENTS 4,297,527 A * 10/1981 Pate .................. H03G 3/32
 381/107
4,956,867 A * 9/1990 Zurek .................... H04R 3/005
 381/71.11

(Continued)

*Primary Examiner* — Leshui Zhang
(74) *Attorney, Agent, or Firm* — Schiff Hardin LLP

(57) ABSTRACT

A controller for controlling an amplification gain of an amplifier for amplifying a high dynamic range signal for an analog to digital converter comprises an input interface adapted to receive a representation of the high dynamic range signal and a signal compressor adapted to provide a low amplitude representation of the high dynamic range signal, the low amplitude representation having a lower signal amplitude than the high dynamic range signal. A comparator is adapted to compare the signal amplitude of the low amplitude representation with a predetermined threshold and an output interface is adapted to provide a control signal to the amplifier, the control signal being adapted to control the amplification gain of the amplifier such that the amplification gain is lowered when the signal amplitude of the low amplitude representation exceeds the predetermined threshold.

10 Claims, 4 Drawing Sheets

(56) References Cited

U.S. PATENT DOCUMENTS

2005/0123152 A1* 6/2005 Magrath ............... H03G 7/007
  381/104

2007/0174062 A1* 7/2007 Mehrotra ............. G10L 21/038
  704/500
2010/0183167 A1* 7/2010 Phelps ................ H04M 1/6008
  381/94.1

* cited by examiner

APPARATUS AND METHOD FOR CONTROLLING AN AMPLIFICATION GAIN OF AN AMPLIFIER, AND A DIGITIZER CIRCUIT AND MICROPHONE ASSEMBLY

TECHNICAL FIELD

Embodiments relate to an apparatus and a method for controlling an amplification gain of an amplifier, for example for controlling an amplifier used within a digitizer circuit of a microphone assembly.

BACKGROUND

Applications in which an amplification gain of a variable amplifier is to be controlled are various. In digitizer circuits, variable amplifiers may be used to pre-amplify an analog signal for a subsequent analog-to-digital converter. When the analog signals to be digitized have a high dynamic range, which corresponds to an amplitude varying by a considerable amount, it may be necessary to adjust the amplification gain of the amplifier so as to not operate the analog-to-digital (A/D) converter outside of its dynamic range. That is saturation of the A/D converter should be avoided. Saturation of the A/D converter can be detected by an inspection of the digital signal provided by the A/D converter. When subsequent samples of the digital signal have the maximum digital value of the A/D circuit, one may assume that the A/D converter is operated with an analog signal having an amplitude beyond the capability or range of the A/D converter. Even though one may use more complicated criteria in the digital domain, such as for example predictive filters to detect that the A/D converter is about to be saturated, the detection may take too long in order to avoid saturation, in particular in the presence of signals with a high dynamic range and high slew-rates. Signals with high slew-rates have amplitude that varies strongly over short periods of time. Hence, it may not be feasible to adapt the amplification gain of an amplifier timely enough to avoid saturation of the A/D converter, which may result in a degradation of the signal quality in the digital domain, for example, when a signal of a microphone has to be digitized. This may, for example, even result in a listener which is no longer capable of understanding the voice of a speecher, e.g. during a podium discussion or within a telephone conference.

Hence, there appears to be a desire to improve the control of an amplification gain of an amplifier for amplifying a signal with a high dynamic range.

SUMMARY

An embodiment relates to a controller for controlling an amplification gain of an amplifier for amplifying a high dynamic range signal for an analog-to-digital converter, which comprises an input interface adapted to receive a representation of the high dynamic range signal. A signal compressor of the controller is adapted to provide a low amplitude representation of the high dynamic range signal, the low amplitude representation having a lower signal amplitude than the high dynamic range signal. A comparator is adapted to compare the signal amplitude of the low amplitude representation with a predetermined threshold and an output interface of the controller is adapted to provide a control signal to the amplifier which is adapted to lower the amplification gain of the amplifier when the signal amplitude of the low amplitude representation exceeds the predetermined threshold.

That is, a low amplitude representation of a high dynamic range signal is used to determine a condition upon which the gain of the amplifier is changed. This can enable an appropriate adaption of the amplifier's gain even for signals having a high slew rate in a cost efficient manner without requiring excessive amounts of a semiconductor area.

According to some further embodiments, a digitizer circuit comprises an input interface adapted to receive the high dynamic range signal as well as an amplifier adapted to receive the high dynamic range signal and to provide an amplified representation of the high dynamic range signal, the amplifier being controlled by an embodiment of a controller for controlling the amplification gain. The use of a controller deriving a condition upon which an amplification gain of the amplifier is to be adjusted based on a low amplitude representation of the high dynamic range signal can allow for use of a single embodiment of a digitizer circuit for digitizing analog signals from nearly arbitrary sources without the need of tailoring the A/D converter to the particular implementation.

According to further embodiments, a microphone assembly comprises a microphone which is operable to provide a high dynamic range signal at its output as well as an embodiment of a digitizer circuit for providing a digital representation of the high dynamic range signal. This can allow digitizing a microphone signal without distortion, even if the sound to be digitized has an extremely high sound pressure (SP) level (SPL) or variation of the SPL. Also, this can provide for the possibility to provide integrated devices using microphones providing signals with an inherent high dynamic range due to their construction, such as, for example, some Micro-Mechanical-Systems (MEMS)-Microphones.

A further embodiment of a microphone assembly comprises a microphone being operable to provide a high dynamic range signal at a first output and a low amplitude representation of the high dynamic range signal at a second output. That is, a signal to be amplified is provided by the microphone and, at the same time, a low amplitude representation of the high dynamic range signal to be amplified and digitized is also provided by the very same microphone. This can allow for a particularly cost efficient implementation of a digitizer circuit to be used by directly providing a low amplitude representation without the need to create it within the digitizer circuit itself. This benefit may come without additional cost, for example by appropriately producing a MEMS microphone.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
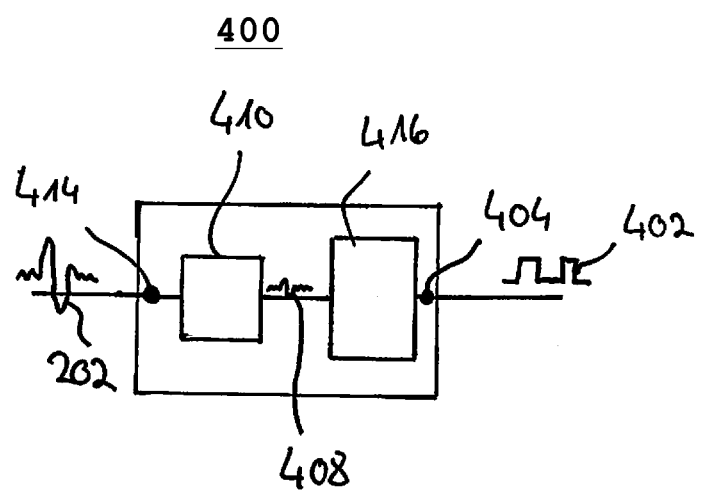
FIG. 1 illustrates an embodiment of a controller for controlling an amplification gain of an amplifier for amplifying a high dynamic range signal for an analog to digital converter.

FIG. 1 shows an embodiment of a controller 400 for controlling an amplification gain of an amplifier for amplifying a high dynamic range signal for an analog to digital converter. The controller 400 comprises an input interface 414 adapted to receive a representation of the high dynamic range signal 202 (representation of the high dynamic range signal). A signal compressor 410 is adapted to provide a low amplitude representation 408 of the high dynamic range signal 202, the low amplitude representation 408 having a lower signal amplitude than the high dynamic range signal 202. A comparator 416 is adapted to compare the signal amplitude of the low amplitude representation 408 with a predetermined threshold. The controller 400 further comprises an output interface 404 adapted to provide a control signal 402 to the amplifier, the control signal 402 being adapted to control the amplification gain of the amplifier such that the amplification gain is lowered when the signal amplitude of the low amplitude representation 408 exceeds the predetermined threshold. The control signal 402 can be implemented in any arbitrary form, e.g. as an analog signal with an amplitude corresponding to the desired amplification gain, as a digital signal indicating the desired amplification gain by means of a digital value, a pulse width modulated signal or the like. Generally speaking, the control signal 402 is meant to correspond to any arbitrary signal or variation of a physical quantity which is capable of altering an amplification gain of an associated amplifier. The signal does not necessarily have to be transmitted by a wired connection but can also be transmitted wirelessly instead, e.g. using a digital transmission protocol like ZIGBEE, Bluetooth, Wireless Local Area Network (WLAN) or the like. A varying supply voltage for the amplifier can also be a control signal 402 in the meaning of the term as used herein, to just name a further alternative. The comparator 416 can be any arbitrary circuitry or device which is capable of determining information about a signal amplitude of the low amplitude representation 408 and to compare the information to an associated threshold criterion. For example, the comparator 416 can comprise a differential amplifier operating in the analog domain to indicate when the amplitude of low amplitude representation 408 exceeds a reference voltage provided to a further input of the differential amplifier. The comparator 416 can also comprise a digitizer circuit to digitize the low amplitude representation 408 first and to perform the comparison or a corresponding further analysis in the digital domain, e.g. using a processor.

The full functionality of the controller 400 of FIG. 1 will in the following be described in the context of the microphone assembly 100, where an embodiment of a controller 400 is used to control an amplifier 302 which appropriately scales a high dynamic range signal 202 for an analog to digital converter 306.

Figure 2:
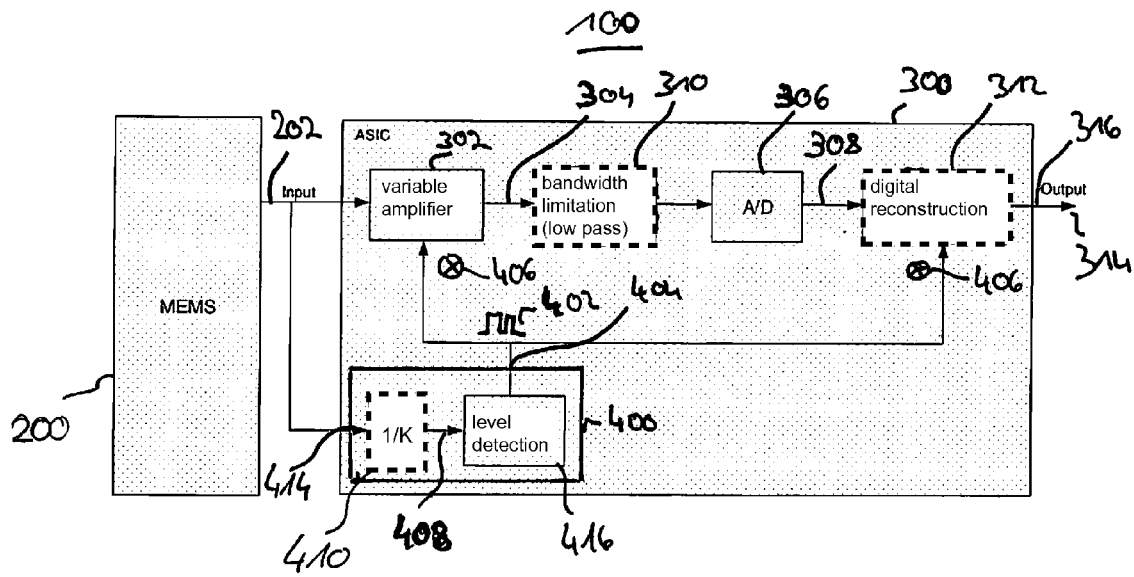
FIG. 2 illustrates an embodiment of a microphone assembly comprising an embodiment of a digitizer circuit and an embodiment of a controller.

FIG. 2 shows an embodiment of a microphone assembly 100. The microphone assembly 100 comprises a microphone 200 and a digitizer circuit 300. The digitizer circuit 300 comprises an amplifier 302 adapted to receive the high dynamic range signal 202 and to provide an amplified representation 304 of the high dynamic range signal. An analog-to-digital converter 306 is adapted to provide a digital representation 308 of the amplified representation 304. In the particular embodiment illustrated in FIG. 2, the digitizer circuit 300 further comprises an optional filter 310 operable to reduce the bandwidth of the amplified representation 304. The filter 310 is optional and, in this particular embodiment, placed in the analog domain. However, further embodiments can be implemented without the use of a filter 310 or, alternatively, using a corresponding filter in the digital domain, i.e. after the analog-to-digital converter 306. The digitizer circuit 300 of FIG. 2 furthermore comprises an optional reconstructor 312 which is adapted to provide a digital reconstruction 314 of the high dynamic range signal 202 at an output 316 of the digitizer circuit 300. Since the reconstructor 312 is optional, further embodiments of digitizer circuits 300 can be implemented without a reconstructor 312. The digitizer circuit 300 principally works as follows.

The amplifier 302 has a variable amplification gain and amplifies or scales the high dynamic range signal 202 provided at its input. To this end, it should be noted that the term amplified representation 304 used for the signal as provided by the amplifier 302 should not be construed to necessarily mean that the amplitude of the amplified representation is higher than the amplitude of the underlying high dynamic range signal itself. To the contrary, the amplified representation may also have a lower amplitude than the original signal, corresponding to a gain factor or to a scaling factor smaller than 1. In particular, when high SPL-signals of MEMS-microphones are to be processed, a gain factor smaller than 1 may be the usual case in order to not saturate the analog-to-digital converter 306.

The amplified representation 304 or, eventually, a bandwith filtered representation of the same is provided to the A/D converter 306 which thus creates a digital representation 308 of the amplified representation 304. The digital representation 308 can, for example, be composed of a consecutive number (stream) of digital values representing the amplified representation 304 and, hence, also the high dynamic range signal 202. A single digital value may correspond to the amplitude of the amplified representation 304 at a certain time instant. In order to not saturate the A/D converter 306, the controller 400 is adapted to provide a control signal 402 at its output 404, the control signal 402 being adapted to control an amplification gain of the amplifier 302. For example, the control signal 402 may correspond to a scaling factor 406 indicating in absolute or relative terms how much the present amplification should be altered (lowered or increased) from its present value. That is, the control signal can cause the amplifier to lower or increase the present amplification gain by a certain percentage or by a certain amount. Of course, the control signal 402 can alternatively also be operable to indicate an overall absolute gain value or scaling factor to be applied to the high dynamic range signal 202 rather than providing a relative change. That is, the control signal can also be operative to set a specific amplification gain, e.g. a gain of 0.5 or any arbitrary other ratio of amplitudes of the signal at the output and at the input of the amplifier 302.

In particular, the control signal is provided such that the amplification gain is lowered when the signal amplitude of a low amplitude representation 408 of the high dynamic range signal 202 exceeds a predetermined threshold.

In order to provide the low amplitude representation 408, the controller 400 of FIG. 2 comprises a signal compressor 410. The signal compressor 410 receives, as an input, the high dynamic range signal 202 and provides, as an output, the low amplitude representation 408. In this particular case, the low amplitude representation 408 is created by dividing the amplitude of the high dynamic range signal 202 by a fixed value K. As detailed below, further embodiments of digitizer circuits can also embody controllers 400 without a signal compressor 410. The functionality as described herein can also be provided without the use of a signal compressor 410 within the controller. In such an embodiment, the comparator can receive a low amplitude representation 408 of the signal to be digitized by arbitrary other means, i.e. by the use of a particularly designed MEMS-microphone, which will be described with respect to FIGS. 4 and 5 in the following paragraphs.

In summary, the embodiment of FIG. 2 uses a controller 400 to control an amplification gain of the amplifier 302 so that the amplification gain is lowered when the signal amplitude of the low amplitude representation 408 exceeds a predetermined threshold. To this end, the high dynamic range signal 202 is compressed by a signal compressor 410, for example by dividing the amplitude by a predetermined scale factor. According to further embodiments, the low amplitude representation 408 can be provided or created by any other means, that is not necessarily by division by a predetermined factor.

While the determination of whether a signal saturates the analog-to-digital converter 306 can also be performed in the digital domain and based on the digital representation 308, embodiments allow, by use of a controller 400, to determine the required information independently from the A/D converter 306. Using such a topology avoids long and time-consuming signal paths (e.g. caused by the sample and hold times of the A/D converter or the delays of digital filters) and can, therefore, avoid saturation of the A/D converter 306 which may otherwise occur for high dynamic range signals having high slew rates.

Figure 3:
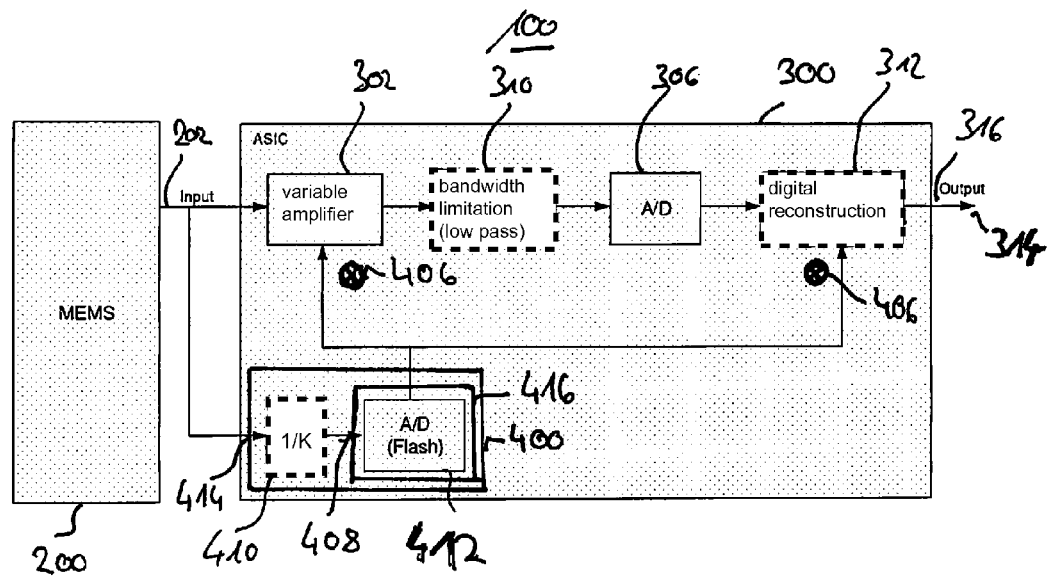
FIG. 3 shows a further embodiment of a microphone assembly.

The required control signal for the amplifier 302 can be provided with high efficiency, e.g. consuming only little semiconductor area and power, since the performance requirements of the level detection or the controller and its associated circuitry can be maintained low as compared to the A/D converter 306. The level detection can be performed in the analog domain, as indicated in FIG. 2 or, alternatively, also in the digital domain, as indicated in FIG. 3. That is, the controller 400 of the embodiment of FIG. 3 comprises a further digitizer circuit 412 in order to digitize the low amplitude representation 408. That is, the level detection, i.e. the comparison of an amplitude of the low amplitude representation and the predetermined threshold can also be performed in the digital domain. Due to the limited requirements for the controller 400, a digitizer circuit 412 of a controller 400 can be implemented more cost-efficient than the A/D converter 306 and, for example, with a much lower resolution, still providing the additional benefits of using an embodiment of a controller 400. For example, a resolution of 4 bits may be sufficient, allowing to provide 16 different levels of variable gain of the amplifier 302.

Before turning to further embodiments, it may be noted that although a complete microphone assembly 100 is described with respect to FIG. 2, already individual components of the microphone assembly 100 can form individual embodiments. In particular, an embodiment of the controller 400 is an individual embodiment on its own, as well as an embodiment of a digitizer circuit 300.

That is, further embodiments can be formed by the components of the digitizer circuit 300 alone and yet further embodiments can be formed by the components of the controller 400 alone. In particular, a controller 400 according to embodiments comprises an input interface 414 adapted to receive a representation of the high dynamic range signal 202, a signal compressor 410 adapted to provide a low amplitude representation 408 of the high dynamic range signal 202, the low amplitude representation 408 having a lower signal amplitude than the high dynamic range signal 202 and a comparator 416 adapted to compare the signal amplitude of the low amplitude representation 408 with a predetermined threshold. The output interface 404 of the controller 400 is adapted to provide a control signal 402 to the amplifier 302, the control signal being adapted to control the amplification gain of the amplifier 302 such that the amplification gain is lowered when the signal amplitude of the low amplitude representation 408 exceeds the predetermined threshold.

Embodiments can allow processing of signals of a high dynamic range and with extremely high slew rates, which leads to strong variations of the signal at the input of the A/D converter 406 on small time scales. In order to provide an appropriate control signal 402, embodiments of controllers 400 can use a level detection in the analog or in the digital domain using a further A/D converter or digitizer circuit 412.

In principle, digitizer circuits as illustrated in FIGS. 2 and 3 allow fast and efficient adaption of amplifier gains depending on the level of the high dynamic range signal. In case of high signal amplitudes to be processed, the gain factor of the amplifier 302 is reduced (compression of the signal is performed) to not saturate the A/D converter 306. While this may result in a reduction of the signal-to-noise-ratio (SNR) this may well be acceptable, depending on the application. In order to compensate for a reduction or an increase of the gain, e.g. by the variation of the present gain by a scaling factor 406, some embodiments of digitizer circuits 300 comprise a reconstructor 312 which rescales the signal in the digital domain. That is, the reduction or increase in amplitude as performed in the analog domain by the amplifier 302 is reversed in the digital domain by the reconstructor 312 so as to maintain an overall scale of the signal as provided at the output 316 of the digitizer circuit 300. In conventional digitizer circuits, the dynamic range of the A/D converter is tailored to the maximum expected amplitude, which may result in a good SNR. Depending on the particular implementation, linear scaling of the SNR with increasing signal level may be of minor importance, as for example when using microphones as an input to a digitizer circuit. Using microphones, the signal-to-noise-ratio may remain constant from a particular sound pressure level (SPL), e.g. starting from 94 dB SPL. Utilizing a conventional approach for such applications, an A/D converter would have to be tailored to the maximum expected value, which may result in an enormous overhead and in additional costs, with respect to, for example, semiconductor area and power consumption. According to the particular implementations, such a design may not even be possible, for example when considering the digitalization of microphone signals of very high SPL of, for example, 140 dB and beyond.

An unnecessary overhead, however, can be avoided by using embodiments of digitizer circuits 300 or embodiments of controllers 400. A signal level or amplitude of the high dynamic range signal 202 at the input of the controller 400 or the digitizer circuit 300 can be compared with different threshold values so that the amplification gain of the amplifier 302 can be reduced in several steps so that a saturation of the A/D converter 306 within the signal path can be avoided. A reconstructor 312 to reverse the reduction or variation of amplification gain can be implemented using arbitrary common techniques, e.g. FIR-filters of first or higher orders.

Before commenting on further embodiments, it is explicitly noted that comparing the signal amplitude of the lower amplitude representation with a predetermined threshold does not necessarily mean that the threshold is a single threshold or that multiple thresholds are used. To the contrary, a continuous function defining the threshold or, generally, a reference function can also be used so that the scaling factor or the control signal of the controller may be defined by a continuous function associating a signal amplitude of the low amplitude representation with a particular scaling factor or amplification gain.

Figure 4:
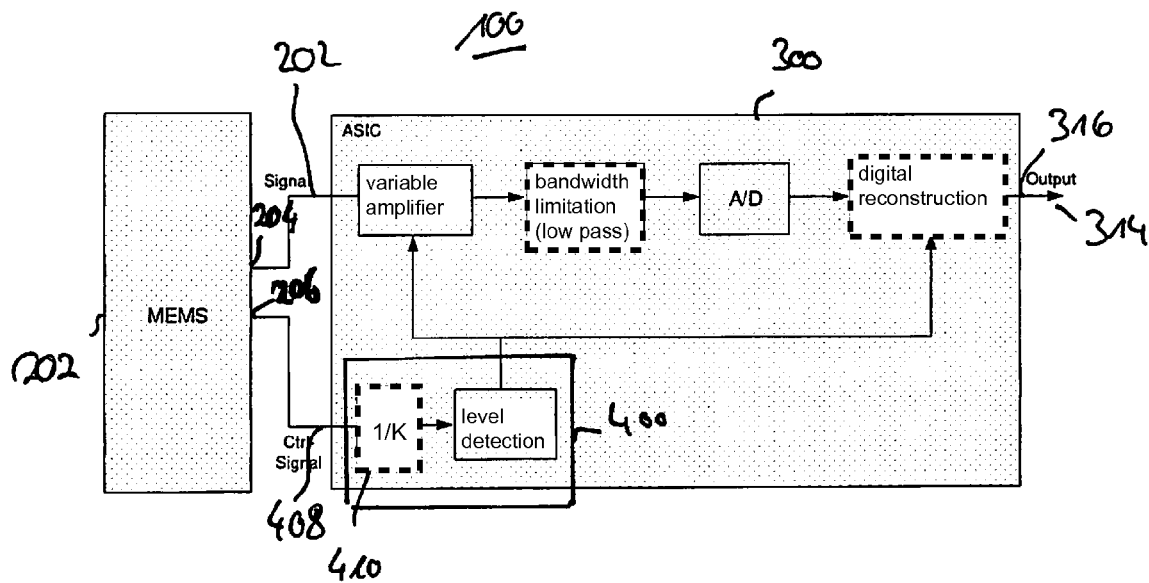
FIG. 4 shows a further embodiment of a microphone assembly.

According to the further embodiment illustrated in FIG. 4, the controller 400 receives the low amplitude representation 408 as a separate signal directly from a particularly adapted MEMS-microphone 202. To this end, the MEMS-microphone 202 provides a first output 204 for the high dynamic range signal 202 and a second output 206 for the low amplitude representation 408.

While the particular embodiment of the controller 400 as illustrated in FIG. 4 also comprises a signal compressor 410 in order to possibly decrease the amplitude of the lower amplitude representation 404 further, further embodiments can alternatively use a controller 400 without a signal compressor 410. Those embodiments can use a specially designed microphone 202, which already provides appropriate high dynamic range signals 204 and low amplitude representations 408 of the high dynamic range signal so that the low amplitude representation 408 can be provided to the comparator 416 directly.

Figure 5:
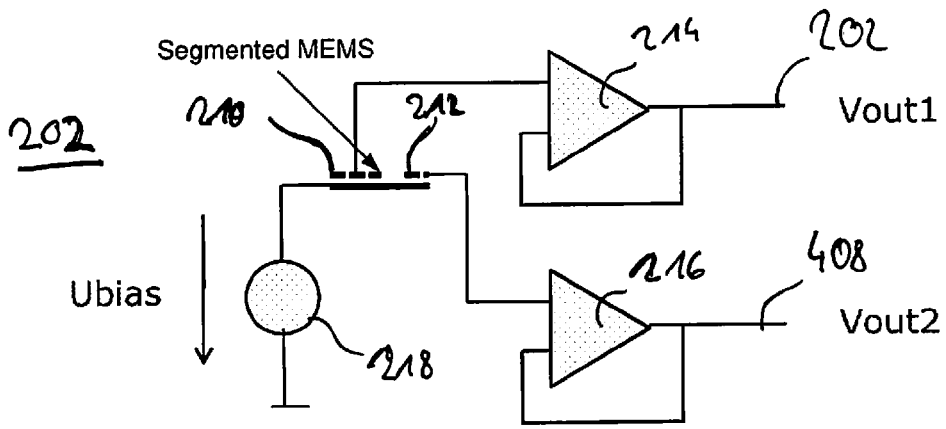
FIG. 5 shows a circuit diagram illustrating the MEMS-microphone used in the embodiment of FIG. 4 schematically.

To this end, a MEMS-microphone 202 as illustrated in FIG. 5 can be used. One particular way of implementing such a microphone can be to use a so-called segmented MEMS-microphone 202, comprising at least two separate membrane areas.

Generally, MEMS-microphones comprise a membrane which is manufactured using standard semiconductor processes and which is hence implemented on a very small scale. The membrane moves with respect to a reference plane due to the impacting sound pressure. Therefore, the capacitance of the reference plane with respect to the elongated membrane varies. Two principal ways of receiving a high dynamic range signal from such a MEMS-microphone by appropriate different external circuitry may be used. One is the creation of a constant charge MEMS-microphone so that the change of capacitance due to the sound pressure results in a varying voltage of the membrane with respect to the substrate or the reference plane. According to further implementations, the membrane is maintained on a constant reference voltage so that the varying capacitance results in a varying charge which is measured in order to receive a high dynamic range microphone signal.

Independent from the particular implementation of the MEMS-microphone, a MEMS-microphone 202 having a so-called segmented membrane comprising at least a first membrane area 210 and a second, independent membrane area 212 may be used. The signal provided by the first membrane area 210 can be used to provide the high dynamic range signal 202 and the signal provided by the second membrane area 212 can be used to provide the low amplitude representation 408.

FIG. 5 shows a schematic illustration of a particular example of such a MEMS-microphone 202. The signals are provided by a first operational amplifier 214 and a second operational amplifier 216. Further, a reference voltage or bias voltage 218 is applied to the reference plane opposing the segmented membrane. In one implementation, the second membrane area 212 comprises an area at the border of the complete membrane area, while the first membrane area 210 is centered within the complete area.

This can result with a high dynamic range signal depending on the sound pressure with high linearity, since the signal is generated by a central first membrane area 210 which moves approximately linearly with respect to the reference plane. To the contrary, the outer membrane area 212 which surrounds the central first membrane area 210 can directly provide the low amplitude representation when the area of the second membrane area 212 is chosen to be sufficiently small with respect to the area of the first membrane area 210. Nonelinearities appearing due to the membrane area 212 being at the border of the membrane may have no significant impact on the general functionality of the whole system since the information provided to the controller 400 may be relatively imprecise as compared to the high dynamic range signal while still allowing for adjustment of the amplifier appropriately.

In other words, particular embodiments of microphone assemblies can use MEMS-microphones 202 with segmented membranes as illustrated in FIGS. 4 and 5. The first membrane area 210 is coupled with the first output 204 of the MEMS-microphone 202 so as to provide the high dynamic range signal 202 and the second output 206 of the MEMS-microphone 202 is coupled to the second output 206 so as to provide the low amplitude representation 408 directly. In one embodiment, the second membrane area 212 completely surrounds the first membrane area 210, which can, for example, be substantially square or circular.

In other words, further embodiments can have the topology illustrated in FIGS. 4 and 5, which differs from the embodiments shown in FIGS. 2 and 3 in that the MEMS-microphone 202 provides a first and second output signal. The high dynamic range signal 202 and the low amplitude representation 408 used for level detection are provided by the MEMS-microphone 202 directly. As in previous embodiments, the low amplitude representation 408 needs to be only a course representation of the high dynamic range signal 202 in order to effectively provide the benefits of the invention. As illustrated in FIG. 5, a segmented MEMS-microphone 202 can be utilized to provide for the high dynamic range signal 202 and for the low amplitude representation 408. The membrane can be segmented into two or more independent areas. Since the membrane area at the border of the membrane can show some non-linearities, it can be beneficial to use the second membrane area 212 at the border of the membrane for the generation of the low amplitude representation 408.

Figure 6:
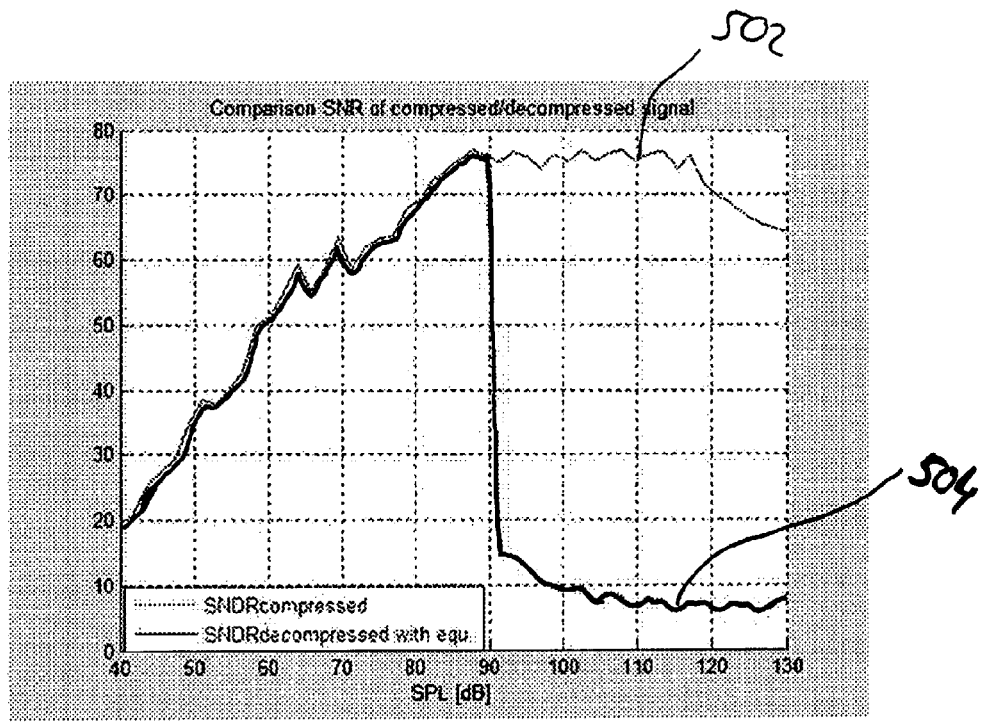
FIG. 6 shows an illustration of a signal-to-noise-ratio comparing compressed and decompressed signals.

FIG. 6 shows two graphs illustrating a signal-to-noise ratio and its dependency from the sound pressure level SPL acting on the membrane of a microphone of a microphone assembly according to one of the embodiments of FIGS. 2 to 5. That is, the x-axis shows the sound pressure level in dB and y-axis shows the SNR. The first graph 502 shows the signal-to-noise ratio of a decompressed signal as compared to a compressed signal 504. While a compressed signal 504 may show a significantly smaller signal-to-noise ratio for high SPL, the corresponding degradation of the recorded signal may be negligible in microphone applications.

Figure 7:
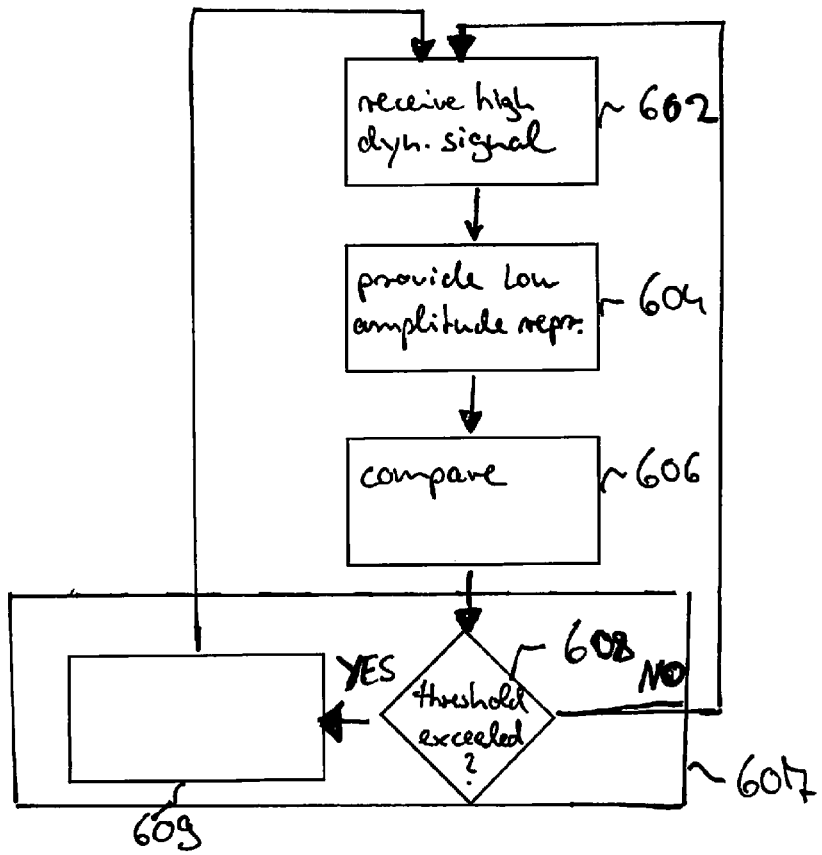
FIG. 7 shows a flow chart of an embodiment of a method for controlling an amplification gain of an amplifier.

FIG. 7 shows a flow chart of an embodiment of a method for controlling an amplification gain of an amplifier for amplifying a high dynamic range signal for an analog-to-digital converter. The method comprises reception at 602, where a representation of the high dynamic range signal is received and a provision at 604 where a low amplitude representation of the high dynamic range signal is provided. In a comparison at 606, the signal amplitude of the low amplitude representation is compared with the predetermined threshold. A provision at 607 comprises a decision-making at 608 and a sending at 609.

In the decision-making at 608, whether the signal amplitude of the low amplitude representation exceeds the predetermined threshold can be determined. If this is the case, a control signal is provided for the amplifier in the sending at 609 so that the amplification gain of the amplifier is lowered. If this is not the case, the message restarts at the receiving at 602.

Embodiments can further provide a computer program having a program code for performing one of the above methods, when the computer program is executed on a computer or processor. A person of ordinary skill in the art would readily recognize that steps of various above-described methods can be performed by programmed computers. Herein, some embodiments are also intended to cover program storage devices, e.g., digital data storage media, which are machine or computer readable and encode machine-executable or computer-executable programs of instructions, wherein the instructions perform some or all of the acts of the above-described methods. The program storage devices can be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A digitizer circuit for providing a digital representation of a high dynamic range signal of a microphone, comprising:
    an input interface adapted to receive the high dynamic range signal;
    an amplifier adapted to receive the high dynamic range signal and to provide an amplified representation of the high dynamic range signal, wherein the amplifier has a controllable amplification gain;
    an analog to digital converter adapted to provide a digital representation of the amplified representation; and
    a controller for controlling the amplification gain of the amplifier, the controller comprising:
        a signal compressor adapted to provide a low amplitude representation using the high dynamic range signal;
        a comparator adapted to compare the signal amplitude of the low amplitude representation with a predetermined threshold;
        an output interface adapted to provide a control signal to the amplifier, the control signal being adapted to control the amplification gain of the amplifier such that the amplification gain is lowered by a scaling factor when the signal amplitude of the low amplitude representation exceeds the predetermined threshold; and
        a reconstructor operable to provide a digital reconstruction of the high dynamic range signal using the digital representation, the reconstructor being operable to increase the amplitude of the digital representation by the scaling factor to provide the digital reconstruction.

2. The digitizer circuit of claim 1, wherein the controller further comprises:
    a signal compressor adapted to provide the low amplitude representation using the high dynamic range signal.

3. The digitizer circuit of claim 1, wherein the comparator comprises a digitizer circuit, the digitizer circuit of the comparator being adapted to provide a digital representation of the low amplitude representation, wherein a resolution of the digitizer circuit of the comparator is lower than a resolution of the analog to digital converter.

4. The digitizer circuit of claim 1, further comprising a high frequency filter coupled to an output of the amplifier, the high frequency filter being operable to provide a filtered representation of the amplified representation to an input of the analog to digital converter.

5. The digitizer circuit of claim 1, further comprising a microphone coupled to the input interface, the microphone being adapted to provide the high dynamic range signal.

6. The digitizer circuit of claim 5, wherein the microphone is Micro-Electro-Mechanical-System (MEMS) microphone, the microphone and the digitizer circuit being located on a common semiconductor substrate.

7. A microphone assembly, comprising:
    a microphone, the microphone being operable to provide a high dynamic range signal as an output; and
    a digitizer circuit for providing a digital representation of a high dynamic range signal, comprising:
        an input interface coupled to the output of the microphone and adapted to receive the high dynamic range signal;
        an amplifier adapted to receive the high dynamic range signal and to provide an amplified representation of the high dynamic range signal, wherein the amplifier has a controllable amplification gain;
        an analog to digital converter adapted to provide a digital representation of the amplified representation; and
        a controller for controlling the amplification gain of the amplifier, the controller comprising:
            a signal compressor adapted to provide a low amplitude representation using the high dynamic range signal;
            a comparator adapted to compare the signal amplitude of the low amplitude representation with a predetermined threshold;
            an output interface adapted to provide a control signal to the amplifier, the control signal being adapted to control the amplification gain of the amplifier such that the amplification gain is lowered by a scaling factor when the signal amplitude of the low amplitude representation exceeds the predetermined threshold; and
            a reconstructor operable to provide a digital reconstruction of the high dynamic range signal using the digital representation, the reconstructor being operable to increase the amplitude of the digital representation by the scaling factor to provide the digital reconstruction.

8. The digitizer circuit of claim 7, wherein the comparator comprises a digitizer circuit, the digitizer circuit of the comparator being adapted to provide a digital representation of the low amplitude representation, wherein a resolution of the digitizer circuit of the comparator is lower than a resolution of the analog to digital converter.

9. The digitizer circuit of claim 7, further comprising a high frequency filter coupled to an output of the amplifier, the high frequency filer being operable to provide a filtered representation of the amplified representation to an input of the analog to digital converter.

10. The digitizer circuit of claim 7, wherein the microphone is Micro-Electro-Mechanical-System (MEMS) microphone, the microphone and the digitizer circuit being located on a common semiconductor substrate.

* * * * *